United States Patent
Downing

(10) Patent No.: US 9,095,075 B2
(45) Date of Patent: Jul. 28, 2015

(54) ENCLOSURE FOR ELECTRONIC COMPONENTS WITH ENHANCED COOLING

(71) Applicant: Robert Scott Downing, Rockford, IL (US)

(72) Inventor: Robert Scott Downing, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 312 days.

(21) Appl. No.: 13/686,301

(22) Filed: Nov. 27, 2012

(65) Prior Publication Data

US 2014/0146474 A1    May 29, 2014

(51) Int. Cl.
*H05K 7/20* (2006.01)
*H01L 23/473* (2006.01)

(52) U.S. Cl.
CPC ............ *H05K 7/202* (2013.01); *H05K 7/206* (2013.01)

(58) Field of Classification Search
CPC ........... H05K 7/20218–7/20381; H01L 23/473
USPC ....................... 361/679.46–679.54, 688–723;
165/80.1–80.5, 104.33, 185;
174/15.1–15.2, 16.1–16.3, 521, 526,
174/547–548; 257/712–722, E23.088;
454/184; 312/236
See application file for complete search history.

(56) References Cited

U.S. PATENT DOCUMENTS

| | | | |
|---|---|---|---|
| 4,495,780 A | 1/1985 | Kaneko et al. | |
| 5,136,856 A | 8/1992 | Yamamoto et al. | |
| 5,709,558 A | 1/1998 | Dreyer et al. | |
| 5,856,909 A | 1/1999 | Kamo et al. | |
| 6,051,783 A | 4/2000 | Dreyer et al. | |
| 6,213,195 B1 | 4/2001 | Downing et al. | |
| 6,313,990 B1 * | 11/2001 | Cheon | 361/699 |
| 6,396,694 B1 | 5/2002 | van den Berg | |
| 6,525,935 B2 * | 2/2003 | Casebolt | 361/679.46 |
| 6,690,575 B1 * | 2/2004 | Banton et al. | 361/690 |
| 6,826,046 B1 * | 11/2004 | Muncaster et al. | 361/679.33 |
| 6,955,212 B1 * | 10/2005 | Hsieh | 165/80.4 |
| 7,002,799 B2 * | 2/2006 | Malone et al. | 361/699 |
| 7,075,399 B2 | 7/2006 | Saban et al. | |
| 7,372,698 B1 * | 5/2008 | Tilton et al. | 361/701 |
| 7,400,500 B2 * | 7/2008 | Ip et al. | 361/679.48 |
| 8,056,615 B2 | 11/2011 | Downing | |
| 8,077,463 B2 * | 12/2011 | Lee | 361/700 |
| 8,295,046 B2 | 10/2012 | St. Rock et al. | |
| 8,797,741 B2 * | 8/2014 | Altman | 361/702 |
| 2002/0126449 A1 * | 9/2002 | Casebolt | 361/687 |
| 2004/0011511 A1 * | 1/2004 | Ghosh et al. | 165/104.21 |
| 2004/0016257 A1 * | 1/2004 | Wei | 62/259.2 |
| 2004/0027799 A1 * | 2/2004 | King et al. | 361/687 |
| 2005/0168938 A1 * | 8/2005 | Bash et al. | 361/687 |

(Continued)

FOREIGN PATENT DOCUMENTS

EP    0444570 B1    2/1999

*Primary Examiner* — Anthony Haughton
*Assistant Examiner* — Razmeen Gafur
(74) *Attorney, Agent, or Firm* — Cantor Colburn LLP

(57) ABSTRACT

An enclosure is provided and includes a frame defining an interior and a pathway, the frame being configured to prevent external air infiltration to the interior, a divider disposed to divide the interior into first and second chambers that are each fluidly communicative with the pathway and a blower including a cold-plate configured to cool first electronic components disposed on the cold plate, second electronic components disposed in the second chamber and third electronic components disposed in the first chamber by cycling air through the first chamber, the second chamber and the airflow pathway.

20 Claims, 4 Drawing Sheets

(56) References Cited

U.S. PATENT DOCUMENTS

| | | |
|---|---|---|
| 2005/0231913 A1* | 10/2005 | Malone et al. ............ 361/698 |
| 2006/0044758 A1* | 3/2006 | Spangberg ............... 361/695 |
| 2007/0109739 A1* | 5/2007 | Stefanoski ............... 361/687 |
| 2007/0125523 A1* | 6/2007 | Bhatti et al. ........... 165/104.33 |
| 2008/0117590 A1* | 5/2008 | Dey et al. ............... 361/687 |
| 2008/0158818 A1* | 7/2008 | Clidaras et al. ........... 361/699 |
| 2009/0059513 A1* | 3/2009 | Hood, III et al. .......... 361/687 |
| 2009/0161312 A1* | 6/2009 | Spearing et al. ........ 361/679.47 |
| 2010/0300652 A1* | 12/2010 | Lee ....................... 165/80.4 |
| 2011/0205708 A1* | 8/2011 | Andry et al. ............. 361/702 |
| 2011/0245976 A1* | 10/2011 | Thompson et al. ......... 700/275 |
| 2011/0299240 A1* | 12/2011 | Kimura et al. ......... 361/679.49 |
| 2012/0037624 A1 | 2/2012 | Wahba et al. |
| 2012/0044630 A1* | 2/2012 | Elwany ................ 361/679.47 |
| 2012/0050990 A1 | 3/2012 | Kaslusky et al. |
| 2012/0073874 A1 | 3/2012 | Phillips et al. |
| 2012/0206880 A1 | 8/2012 | Andres et al. |

\* cited by examiner

ENCLOSURE FOR ELECTRONIC COMPONENTS WITH ENHANCED COOLING

BACKGROUND OF THE INVENTION

The subject matter disclosed herein relates to an enclosure and, more particularly, to an enclosure for electronic components with enhanced cooling.

Cooling of electronics boxes in various industries, such as aerospace applications, is becoming more challenging as heat losses and densities grow and thermal environments deteriorate. Generally, electronics boxes include power conversion or motor drives that typically have low temperature devices, such as switches, capacitors and control circuits disposed on printed wiring boards (PWBs), and higher temperature electromagnets, such as inductors and transformers. These bulky devices are often mounted to the box walls for natural convection air cooling or are conductively cooled by a cold plate that is supplied with coolant from an external cooling loop.

Such conventional packaging tends to exhibit limited cooling effectiveness due to several reasons. Among these is the fact that heat from the windings, the largest source of inefficiencies, of electromagnetics must be conducted through the iron cores to the box walls or the cold plate. Another reason for the limited cooling effectiveness is that the devices with lower temperature limits reside in the same hot air environment as dictated by the hottest part of the transformers and inductors. Additionally, in natural convection or conductively cooled boxes, the high power density switches do not have an effective dedicated heat sink.

BRIEF DESCRIPTION OF THE INVENTION

According to one aspect of the invention, an enclosure is provided and includes a frame defining an interior and a pathway, the frame being configured to prevent external air infiltration to the interior, a divider disposed to divide the interior into first and second chambers that are each fluidly communicative with the pathway and a blower including a cold-plate configured to cool first electronic components disposed on the cold plate, second electronic components disposed in the second chamber and third electronic components disposed in the first chamber by cycling air through the first chamber, the second chamber and the airflow pathway.

According to another aspect of the invention, an enclosure is provided and includes a frame including an inner wall defining an interior and an outer wall defining a pathway between the inner and outer walls, the frame being configured to prevent external air infiltration to the interior, a divider disposed to divide the interior into first and second chambers that are each fluidly communicative with the pathway via through-holes formed in the inner wall, a blower including a cold-plate configured to cycle air through the first chamber, the second chamber and the airflow pathway and electronic components disposed on the cold plate, in the second chamber and in the first chamber in accordance with respective operational requirements thereof.

According to yet another aspect of the invention, an enclosure is provided and includes a frame including an inner wall defining an interior and an outer wall defining a pathway between the inner and outer walls, the frame being configured to prevent external air infiltration to the interior, a divider disposed to divide the interior into first and second chambers that are each fluidly communicative with the pathway via through-holes formed in the inner wall, the divider defining an interior pathway for external coolant, a blower including a cold-plate and being configured to cycle air through the first chamber, from the first chamber to the second chamber via through-holes defined through the divider, through the second chamber and through the airflow pathway and first, second and third electronic components disposed on the cold plate, on the divider in the second chamber and on the divider in the first chamber, respectively, in accordance with respective operational requirements thereof.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

As will be described below, an electronics box with enhanced cooling is a "closed" box, which does not allow for external cooling air to contact interior components. The enhanced cooling of the electronic box is provided by an internal fan and cooler and can improve the thermal management of the electronic box. This is especially true where the interior components of the electronic box are components with different operational temperature limits and/or components that can be effectively cooled by direct convection.

Figure 1:
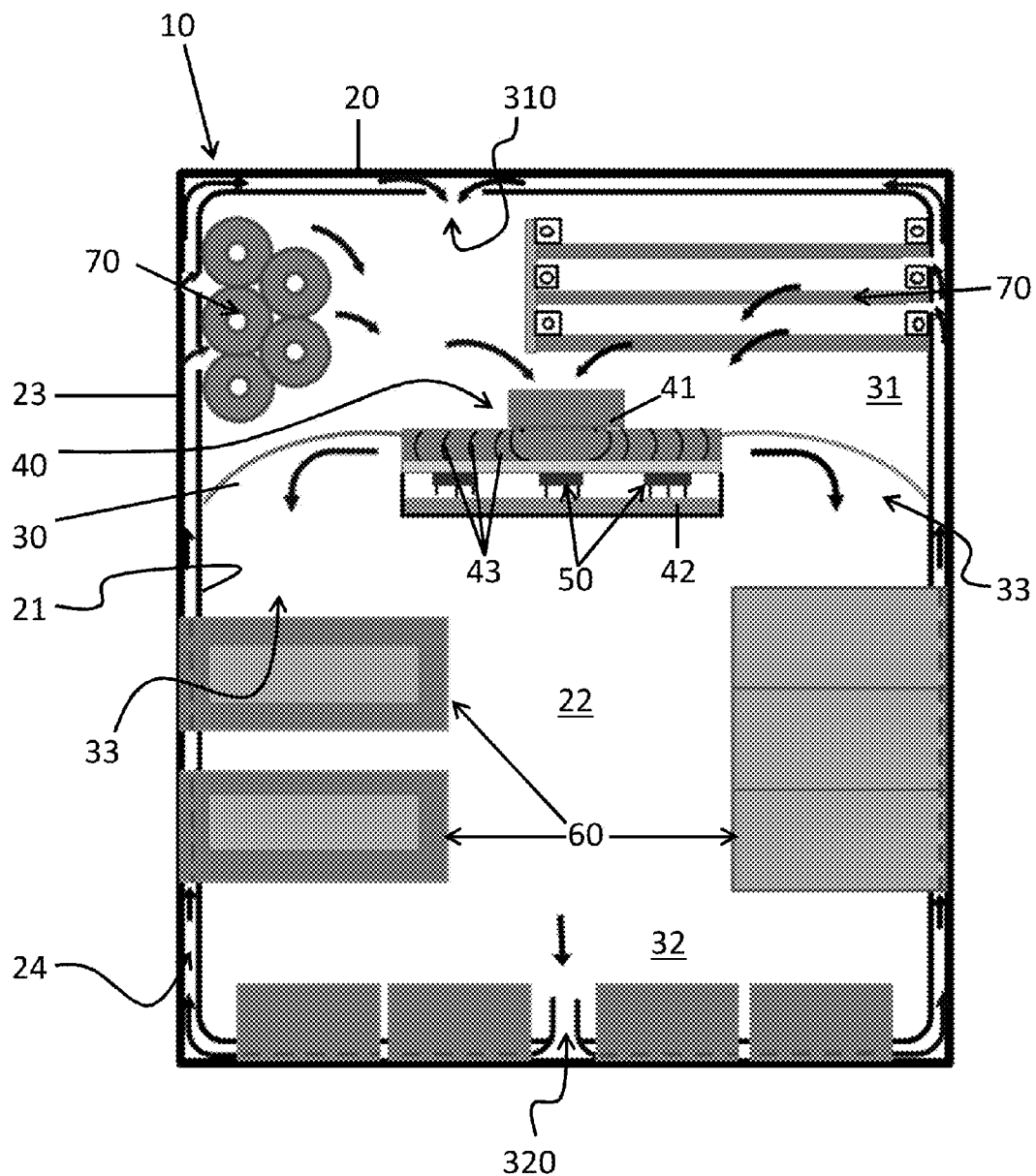
FIG. 1 is a schematic plan view of an enclosure for electronic components with enhanced cooling in accordance with embodiments.

With reference to FIG. 1, an enclosure 10 is provided for use in various industries, such as aerospace applications, and may be required to be "closed." That is, the enclosure 10 may not permit external air to be pumped into its interior for cooling or any other reason. As shown in FIG. 1, the enclosure 10 includes a frame 20, a divider 30 and a blower 40. The frame 20 includes an inner wall 21 defining an interior 22 and an outer wall 23 defining an airflow pathway 24 between an outer surface of the inner wall 21 and in interior surface of the outer wall 23. The frame 20 is configured to prevent external air infiltration to the interior 22. The divider 30 is anchored on an interior surface of the inner wall 21 and disposed within the interior 22 to divide the interior 22 into a first chamber 31 and a second chamber 32. The first chamber 31 is fluidly communicative with the airflow pathway 24 via first through-holes 310 that are formed in the inner wall 21 and the second chamber 32 is fluidly communicative with the airflow pathway 24 via second through-holes 320 that are formed in the inner wall 21. The through-holes 310 are sized and located in such a manner as to flow the coolest air over temperature limited devices and optimize their cooling. The blower 40 includes a fan 41 or another type of airflow generator and a cold plate 42 that is generally disposed in the second chamber 32. The blower 40 is configured to cycle cooling air sequentially from the first chamber 31 to the second chamber 32, through the second chamber 32 to the airflow pathway 24 by way of the second through-holes 320 and through the airflow pathway 24 to the first chamber by way of the first through-holes 310.

The enclosure 10 may further include a first type of electronic component 50 disposed on the cold plate 42, a second type of electronic components 60 disposed in the second chamber 32 and a third type of electronic components 70 disposed in the first chamber 31. The disposition of the first type of the electronic components 50 on the cold plate 42, the second type of the electronic components 60 in the second chamber 32 and the third type of the electronic components 70 in the first chamber 31 is conducted in accordance with respective operational requirements of the first, second and third types of the electronic components 50, 60 and 70, respectively. For example, the disposition may be in accordance with a sensitivity of the first, second and third types of the electronic components 50, 60 and 70 to high temperatures and/or a need of the first, second and third types of the electronic components 50, 60 and 70 for specific types of cooling (i.e., convection, conduction or impingement cooling).

As used herein, it is to be understood that the first, second and third types of electronic components may include electromagnetic components. Also, the first, second and third types of electronic (or electromagnetic) components may often be segregated in the manner described above for reasons having to do with electromagnetic interference (EMI). For example, where any of the first, second and third types of the electronic components include high power transformers and inductors, these may be noisy EMI components that may require shielding from control boards and caps.

Figure 3:
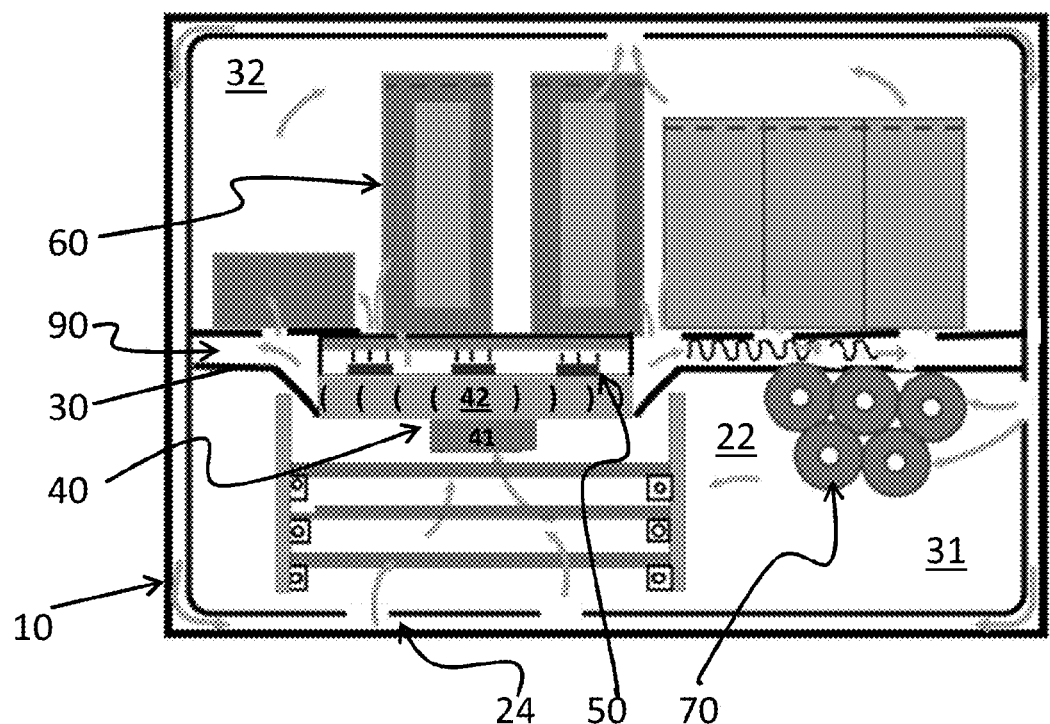
FIG. 3 is a schematic plan view of an enclosure for electronic components with enhanced cooling in accordance with alternative embodiments.
Figure 4:
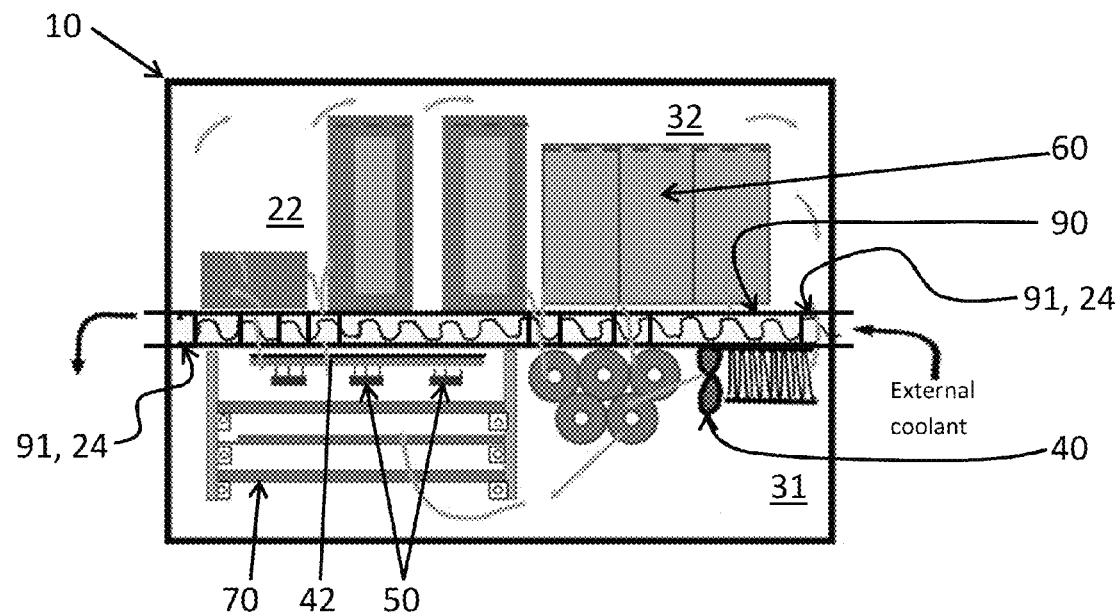
FIG. 4 is a schematic plan view of an enclosure for electronic components with enhanced cooling in accordance with further alternative embodiments.

The enclosure 10 may be provided in any shape or size as required by the particular application the enclosure is being used for. The substantially rectangular shape illustrated in FIG. 1 is merely exemplary and it is to be understood that many other shapes can be employed. However, for purposes of clarity and brevity, the description provided below will relate to the substantially rectangular shape illustrated in FIG. 1 whereby the first chamber 31 is oriented above the second chamber 32 (the opposite orientation is illustrated in FIGS. 3 and 4 with the second chamber 32 above the first chamber 31).

With this arrangement, at least one or more of the second through-holes 320 may be provided as an inlet to the airflow pathway 24 that is defined in a central portion of the second chamber 32 to face upwardly toward the blower 40. Thus, air that flows into the airflow pathway 24 by way of the second through-hole 320 (i.e., the inlet), will flow radially outwardly along a lower extent of the airflow pathway 24 and then turn upward to flow through the airflow pathway 24 along sides of the enclosure 10. The air will then flow into the first chamber 31 by way of first through-holes 310 that are arrayed along the sides of the enclosure 10 or by way of through-holes 310 that are arrayed along an upper extent of the airflow pathway 24. The location and size of the through-holes 310 may be selected to proportion cooling air by component cooling needs. For example, a size of the through-holes 310 may be based on the local velocities needed for cooling. The enclosure 10 becomes highly orientation insensitive because forced air movement replaces the less efficient natural convection. The air that returns to the first chamber 31 will then be drawn into the blower 40 and re-cycled. The blower 40 has a sufficient capacity to provide for the pumping head required to complete the cycle and recycle sequence.

In accordance with embodiments, the divider 30 may be formed with a curvature whereby the divider 30 curves toward the first chamber 31 such that first chamber 31 has a concave shape and the second chamber 32 has a complementarily convex shape. The blower 40 may be disposed at a central portion of the divider 30 and may be configured to generate an airflow directed radially outwardly. This airflow provides direct cooling to the cold plate 42 and thermally interacts with fins 43 that are coupled to the cold plate 42 for additional cooling. Once the radially outwardly directed airflow passes the cold plate 42 and the fins 43, the curvature of the divider 30 re-directs the airflow downward along an exterior 33 of the second chamber 32.

The first type of the electronic components 50 are disposed on the cold plate 42 and include high power and/or highly temperature sensitive electronic components, such as driver electronics and switching elements. The second type of the electronic components 60 are disposed in the second chamber 32 and may be remote from the blower 40. The second type of the electronic components 60 may be characterized as having a greater tolerance to higher temperatures, and may include electromagnetic core elements and electromagnetic windings. The third type of the electronic components 70 are disposed in the first chamber 31 and may be remote from the blower 40. The third type of the electronic components 60 may be characterized as having low temperature operating limits and may include electronics disposed on printed wiring boards (PWBs) and capacitors.

Figure 2:
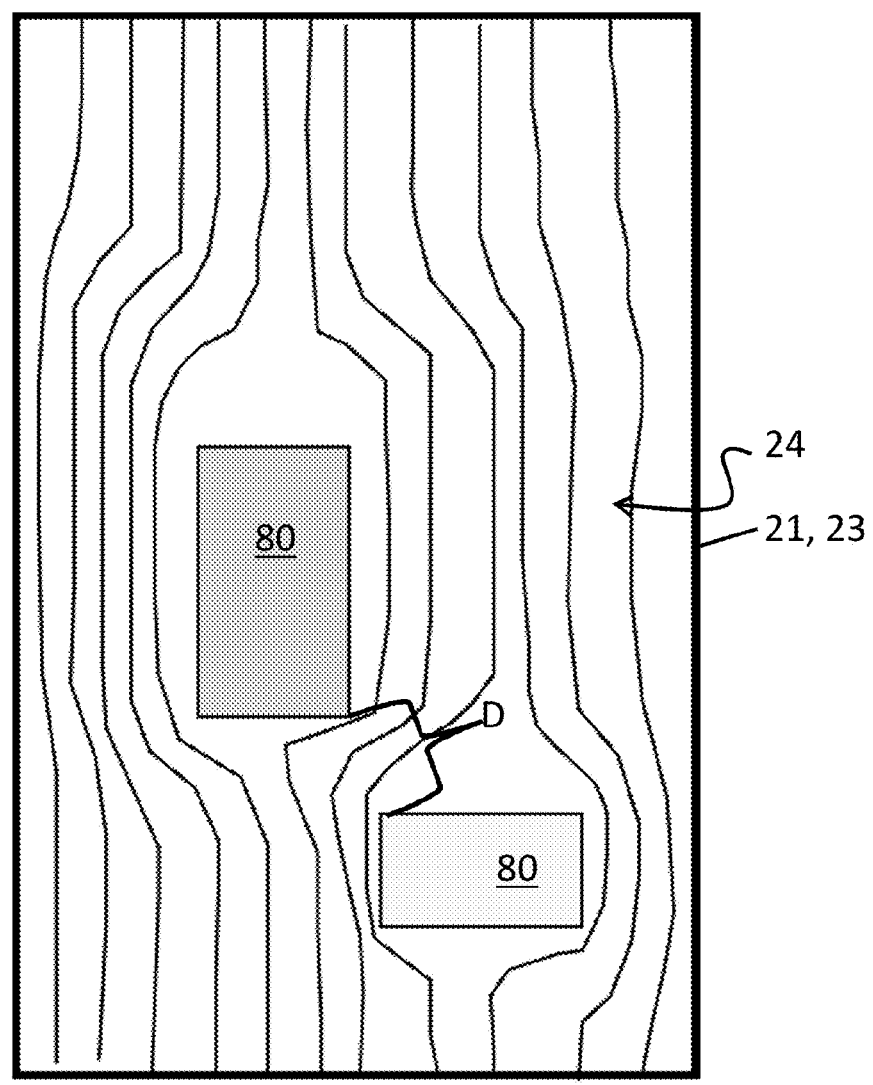
FIG. 2 is a schematic diagram of airflow lines around electromagnetic components that are attached to a outer wall and are disposed within the enclosure of FIG. 1.

With reference to FIGS. 1 and 2, the second and third types of the electronic components 60 and 70 may include components 80 that are mounted directly to the outer wall 23. As shown in FIGS. 1 and 2, such components 80 will traverse the airflow pathway 24 and may be displaced from one another by a distance, D, that is sufficient to permit an airflow between the components 80 and through the airflow pathway 24. In accordance with embodiments, the components 80 may be frame mounted to have a conductive cooling link to outside air.

With reference to FIG. 3, it will be seen that the divider 30 may be formed to define an interior pathway 90 that extends radially outwardly from the blower 40 or, more particularly, the cold plate 42. In this case, the first type of the electronic components 50 may be disposed on the cold plate 42, the second type of the electronic components 60 may be disposed on the divider 30 in the second chamber 32 and the third type of the electronic components 70 may be disposed on the divider 30 in the first chamber 31. With such an arrangement, the blower 40 may be configured to cycle air sequentially through the first chamber 31, into and through the interior pathway 90, into and through the second chamber 32 and into and through the airflow pathway 24 and back into to the first chamber 31.

With reference to FIG. 4, the interior pathway 90 may be fluidly coupled to an external coolant loop whereby external coolant can be pumped into the interior pathway 90 but will otherwise remain isolated from the interior 22. In this case, the first type of the electronic components 50 may be disposed on the cold plate 42, the second type of the electronic components 60 may be disposed on the divider 30 in the second chamber 32 and the third type of the electronic components 70 may be disposed on the divider 30 in the first chamber 31. With such an arrangement, the blower 40 may be configured to cycle air sequentially through the first chamber 31, from the first chamber 31 to the second chamber 32 via through-holes 91 defined through the divider 30, through the second chamber 32 and through the airflow pathway 24.

For any of the embodiments and configurations described above with reference to FIGS. 1, 3 and 4, it will be further understood that the airflow flowing through the airflow pathway 24 may be cooled by external forced airflow that remains isolated from the airflow inside the airflow pathway 24. This cooling effect may be enhanced by configuring the enclosure 10 and/or the external forced airflow to propagate in an opposite direction from the airflow in the airflow pathway 24. Thus, the airflow reaching the first chamber 31 is relatively cool and can in turn cool the third type of the electronic components 70 in the first chamber 31, which are also conductively cooled by their respective mounting to the frame 20.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An enclosure, comprising:
a frame defining an interior and a pathway, the frame being configured to prevent external air infiltration to the interior;
a divider disposed to extend from one side of the frame to an opposite side of the frame to divide the interior into first and second chambers that are each fluidly communicative with the pathway; and
a blower disposed to at least partially traverse the divider and including a fan and a cold-plate adjacent to the fan on which first electronic components are disposed, the fan being configured to generate an airflow to cool the first electronic components disposed on the cold plate and then to cool second electronic components disposed in the second chamber, then to flow from the second electronic components into the pathway and then along the pathway into the first chamber, and then to cool third electronic components disposed in the first chamber.

2. The enclosure according to claim 1, wherein the divider and the blower are configured to encourage airflow to flow along the divider in the second chamber and toward an exterior of the second chamber.

3. The enclosure according to claim 1, wherein the cold plate is disposed in the second chamber and the fan is disposed in the first chamber.

4. The enclosure according to claim 1, wherein the first electronic components comprise highly temperature sensitive electronic components.

5. The enclosure according to claim 1, wherein the second electronic components are remote from the blower.

6. The enclosure according to claim 1, wherein the second electronic components comprise electronic components with greater tolerance to high temperatures than the first electronic components.

7. The enclosure according to claim 1, wherein the third electronic components are remote from the blower.

8. The enclosure according to claim 1, wherein the third electronic components comprise electronic components with low temperature operating limits.

9. An enclosure, comprising:
a frame including an inner wall defining an interior and an outer wall defining a pathway between the inner and outer walls, the frame being configured to prevent external air infiltration to the interior;
a divider disposed to extend from one side of the inner wall to an opposite side of the iner wall to divide the interior into first and second chambers that are each fluidly communicative with the pathway via through-holes formed in the inner wall;
a blower disposed to at least partially traverse the divider and including a fan and a cold-plate adjacent to the fan on which first electronic components are disposed, the fan being configured to generate a cycled airflow to cool the first electronic components disposed on the cold plate and then to cool second electronic components disposed in the second chamber, then to flow from the second electronic components into the pathway and then along the pathway into the first chamber, and then to cool third electronic components disposed in the first chamber.

10. The enclosure according to claim 9, wherein the divider extends outwardly from the blower and is curved to provide the first and second chambers with complementary concave and convex shapes, respectively, and the divider and the blower are configured to encourage airflow to flow along a curvature of the divider in the second chamber toward an exterior of the second chamber.

11. The enclosure according to claim 9, wherein the cold plate is disposed in the second chamber and the fan is disposed in the first chamber.

12. The enclosure according to claim 9, wherein the electronic components disposed on the cold plate comprise highly temperature sensitive electronic components.

13. The enclosure according to claim 9, wherein the electronic components disposed in the second chamber are remote from the blower.

14. The enclosure according to claim 9, wherein the electronic components disposed in the second chamber comprise electronic components with greater tolerance to high temperatures than the electronic components disposed on the cold plate.

15. The enclosure according to claim 9, wherein the electronic components disposed in the first chamber are remote from the blower.

16. The enclosure according to claim 9, wherein the electronic components disposed in the first chamber comprise electronic components with low temperature operating limits.

17. The enclosure according to claim 9, wherein one or more of the electronic components is mounted to the outer wall.

18. The enclosure according to claim 17, wherein the one or more of the electronic components has a conductive cooling link to exterior air.

19. The enclosure according to claim 9, wherein the divider is formed to define an interior pathway extending between the opposite sides of the inner wall, the blower is configured to cycle air through the first chamber, the interior pathway, the second chamber and the airflow pathway, and the second and third electronic components are disposed on the divider in the second and first chambers, respectively.

20. An enclosure, comprising:
a frame including an inner wall defining an interior and an outer wall defining a pathway between the inner and outer walls, the frame being configured to prevent external air infiltration to the interior;

a divider disposed to divide the interior into first and second chambers that are each fluidly communicative with the pathway via through-holes formed in the inner wall, the divider defining an interior pathway for external coolant;

a blower including a cold-plate and being configured to cycle air through the first chamber, from the first chamber to the second chamber via through-holes defined through the divider, through the second chamber and through the airflow pathway; and first, second and third electronic components disposed on the cold plate, on the divider in the second chamber and on the divider in the first chamber, respectively, in accordance with respective operational requirements thereof.

\* \* \* \* \*